(12) United States Patent
Yen et al.

(10) Patent No.: US 6,261,921 B1
(45) Date of Patent: Jul. 17, 2001

(54) METHOD OF FORMING SHALLOW TRENCH ISOLATION STRUCTURE

(75) Inventors: Ching-Lang Yen, Taichung Hsien; Chingfu Lin, Taipei, both of (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 09/395,110

(22) Filed: Sep. 14, 1999

(30) Foreign Application Priority Data

Jul. 31, 1999 (TW) .................................................. 88113097

(51) Int. Cl.[7] .................................................. H01L 21/76
(52) U.S. Cl. ........................................... 438/424; 438/700
(58) Field of Search ...................................... 438/424, 700

(56) References Cited

U.S. PATENT DOCUMENTS

| | | | |
|---|---|---|---|
| 5,989,975 | * 11/1999 | Kuo ....................................... | 438/424 |
| 5,994,229 | * 11/1999 | Chen et al. ........................... | 438/700 |
| 6,001,706 | * 12/1999 | Tan et al. .............................. | 438/424 |
| 6,025,249 | * 2/2000 | Kuo ........................................ | 438/426 |
| 6,121,110 | * 9/2000 | Hong et al. ........................... | 438/400 |
| 6,140,206 | * 10/2000 | Li et al. ................................. | 438/424 |
| 6,140,242 | * 10/2000 | Oh et al. ................................ | 438/698 |
| 6,174,786 | * 1/2001 | Kelley et al. ......................... | 438/425 |

\* cited by examiner

Primary Examiner—John F. Niebling
Assistant Examiner—Lynne A. Gurley
(74) Attorney, Agent, or Firm—Jiawei Huang; J.C. Patents

(57) ABSTRACT

A method of forming a shallow trench isolation structure is described. A mask layer and a photoresist layer with an opening are formed on a substrate in sequence. The photoresist layer serves as an etching mask, and then a portion of the mask layer and a portion of the substrate are etched to form a trench in the substrate. A portion of the photoresist layer is removed, and the opening is in-situ widened. Then, a portion of the mask layer exposed by the widened opening is removed. In addition, a top corner of the trench is rounded after removing the portion of the mask layer. Finally, the trench is filled with an insulation material to form a shallow trench isolation structure.

20 Claims, 2 Drawing Sheets

METHOD OF FORMING SHALLOW TRENCH ISOLATION STRUCTURE

CROSS-REFERENCE TO RELATED APPLICATION

This application claims the priority benefit of Taiwan application Ser. No. 88113097, filed Jul. 31, 1999, the full disclosure of which is incorporated herein by reference.

BACKGROUND OF THE INVENTION

1. Field of Invention

The present invention relates to fabrication of a semiconductor device. More particularly, the present invention relates to a method of forming a shallow trench isolation structure (STI).

2. Description of Related Art

As semiconductor device integration continuously increases, device dimensions are necessarily accordingly reduced. An integrated circuit (IC) is composed of many devices and isolation structures that isolate the devices. The isolation structures, such as shallow trench isolation structures or field oxide isolation structures, are used to prevent carriers from moving between devices. Conventionally, the isolation structures are formed within a concentrated semiconductor circuit, for example, between adjacent field effect transistors (FET) in a dynamic random access memory (DRAM), to reduce a leakage current produced by the FET.

An isolation region is formed in an integrated circuit for preventing a short circuit from occurring between adjacent device regions on a substrate. Conventionally, a local oxidation of silicon (LOCOS) technique is widely utilized in the semiconductor industry to provide isolation regions on the semiconductor device. However, since internal stress is generated and bird's beak encroachment occurs in the isolation structures, LOCOS cannot effectively isolate devices.

The shallow trench isolation technique has been developed to improve the bird's beak encroachment of LOCOS so as to achieve an effective isolation structure. The conventional STI process is the sequential formation of a pad oxide layer and a silicon nitride layer on a substrate. A photolithography step is then performed to define STI areas. The silicon nitride layer, the pad oxide layer and the substrate are sequentially etched to form trenches in the substrate. Regions surrounded by STI are active areas (AA).

A liner oxide layer is formed on the surface of the trenches by thermal oxidation. A silicon dioxide layer is deposited in the trenches and above the silicon nitride mask layer by chemical vapor deposition (CVD). A chemical mechanical polishing (CMP) process is performed to remove the silicon dioxide layer that is higher than the silicon nitride layer to form a STI structure. Finally, hot phosphoric acid is used to remove the silicon nitride layer, and HF solution is used to remove the pad oxide layer.

Since the shallow trench isolation structure has a good isolation effect and its size is scaleable, it is often employed as a device isolation structure. The shallow trench isolation structure is the preferred isolation technique, especially for the fabrication of sub-half micron semiconductor devices.

FIG. 1 is a cross-sectional view schematically illustrating a conventional shallow trench isolation structure. As shown in FIG. 1, because the liner silicon dioxide layer 110 and the shallow trench isolation structure 120 are both made of silicon dioxide, a portion of the liner silicon dioxide layer 110 and a portion of the shallow trench isolation structure 120 are etched during the pad oxide layer etching process.

A divot 130 is easily formed near the top corner of the shallow trench isolation structure 120 due to stress at the top corner of the shallow trench isolation structure 120. A depth of the divot 130 is about 800–1000 Å. The divot 130 leads to a kink effect that causes a threshold voltage reduction. Moreover, in the subsequent poly gate process, polysilicon may fills the divot 130, so that a leakage current is generated. Therefore, the process window of the subsequent poly gate process should be narrowed to avoid the leakage current.

A pullback process is used to avoid the formation of the divot in the shallow trench isolation structure. The pullback process is described as follows. A portion of the silicon nitride layer is etched by, for example, wet etching with hot phosphoric acid to widen the opening in the silicon nitride layer. Therefore, the subsequently formed silicon dioxide layer not only fills the trench but also covers the pad oxide layer. When the pad oxide layer is removed with HF solution, no divot is formed in the shallow trench isolation structure even a portion of the shallow trench isolation structure is etched. In this manner, the leakage current is avoided.

SUMMARY OF THE INVENTION

Accordingly, the present invention provides a method of forming a shallow trench isolation structure to avoid the formation of the divot. In this invention, the top corner of the shallow trench isolation structure is round to reduce stress at the top corner, so that the formation of the divot is avoided.

The present invention provides a method of forming a shallow trench isolation structure. A mask layer and a photoresist layer with an opening are formed on a substrate in sequence. The photoresist layer serves as an etching mask, and then a portion of the mask layer and a portion of the substrate are etched to form a trench in the substrate. A portion of the photoresist layer is removed by isotropic etching process, and the opening is widened. Then, a portion of the mask layer exposed by the widened opening is removed. In addition, a top corner of the trench is round after removing the portion of the mask layer. Finally, the trench is filled with an insulation material to form a shallow trench isolation structure.

Preferably, the portion of the photoresist layer mentioned above is removed by chemical downstream etching, and the removed thickness is about 180–220 Å. The etching gases that can be used here are $CF_4$, $O_2$ and $N_2$, and the flow rate is about 150 to about 250 sccm, about 150 to about 250 sccm and about 20 to about 40 sccm, respectively. The pressure is about 40 to about 50 Pa, and the RF power is about 500 to about 700 watts. As the mask layer is made of silicon nitride, the portion of the mask layer is removed by reactive ion etching. The reactive ion etching process necessarily has a high mask layer to substrate etching selectivity. In accordance with the etching selectivity, the etching gases that can be used here are $CH_3F$ and $O_2$, and the flow rate is about 12 to about 16 sccm and about 36 to about 44 sccm, respectively. The pressure is about 45 to about 55 mtorr, and the RF power is about 200 to about 250 watts.

The feature of this invention is that the opening in the photoresist layer is widened by an etching step performed at a low etching rate. Then, the photoresist layer serves as a mask while removing a portion of the mask layer. Moreover, the rounded corner is formed at the top corner of the trench after the process of removing the portion of the mask layer; thus, stress at the top corner is reduced, and divot formation is avoided. Furthermore, the process window of the poly gate process is widened.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 2A–2D are schematic, cross-sectional views showing the processing steps for forming a shallow trench isolation structure according to one preferred embodiment of this invention.

Figure 1:
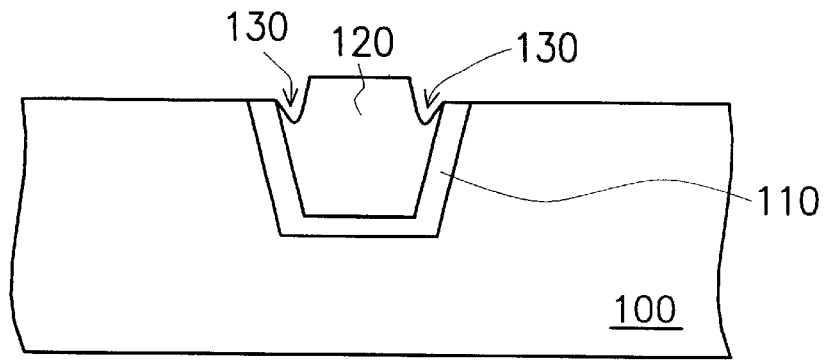
FIG. 1 is a cross-sectional view schematically illustrating a conventional shallow trench isolation structure.
Figure 2A:
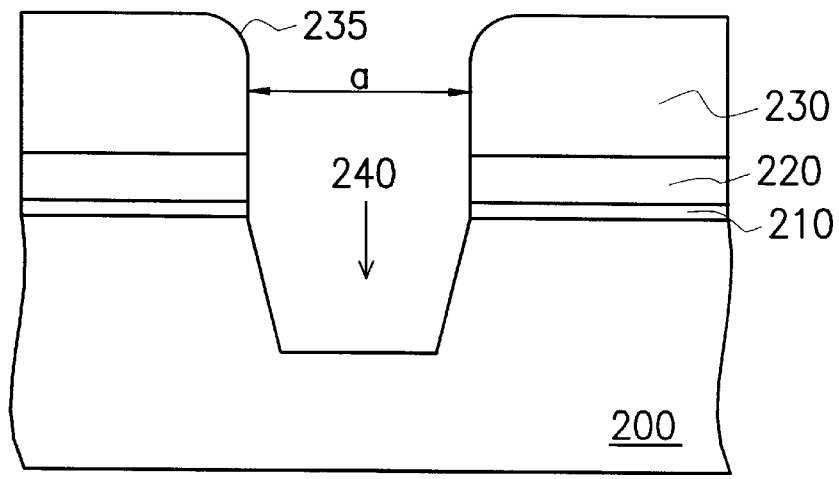
FIGS. 2A–2D are schematic, cross-sectional views showing the processing steps for forming a shallow trench isolation structure according to one preferred embodiment of this invention.

Referring to FIG. 2A, a pad oxide layer 210, a mask layer 220 and a photoresist layer 230 with an opening 235 whose width is "a" are formed in sequence on a substrate 200. Then, a portion of the mask layer 220, a portion of the pad oxide layer 210 and a portion of the substrate 200 are removed by an etching process to form a trench 240 in the substrate 200.

The pad oxide layer 210 is formed by, for example, thermal oxidation at a temperature above 900° C. A material of the mask layer 220 is silicon nitride, for example. The formation of the mask layer 220 is low pressure chemical vapor deposition (LPCVD) with $Si_2H_2Cl_2$ and $NH_3$ as a gas source at about 700–800° C. and about 0.1–1 torr, for example.

The etching step for forming the trench 240 is, for example, reactive ion etching (RIE), and the plasma source in the etching step is transformer coupled plasma (TCP), for example. Parameters for etching the mask layer 220, the pad oxide layer 210 and the substrate 200 are respectively described as follows. While etching the mask layer 220 made of silicon nitride, HBr whose flow rate is about 10–30 sccm and $CF_4$ whose flow rate is about 80–100 sccm are the gas sources, and the pressure in the chamber is about 5 to about 10 mtorr. The TCP power is about 300 to about 500 watts, and the bias power is about 60 to about 100 watts. When the pad oxide layer 210 formed by silicon dioxide is etched, $CF_4$ is the gas source, and the flow rate of $CF_4$ is about 40 to about 60 sccm. The pressure in the chamber is about 50 to about 60 mtorr. The TCP power is about 500 to about 800 watts, and the bias power is about 50 to about 70 watts. A gas source for etching the substrate 200 formed by silicon is $Cl_2$ and $O_2$, and the flow rate of $Cl_2$ is about 80 to about 120 sccm and the flow rate of $O_2$ is about 10 to about 15 sccm. The pressure in the chamber is about 50 to about 70 mtorr. The TCP power is about 300 to about 500 watts, and the bias power is about 200 to about 300 watts.

Figure 2B:
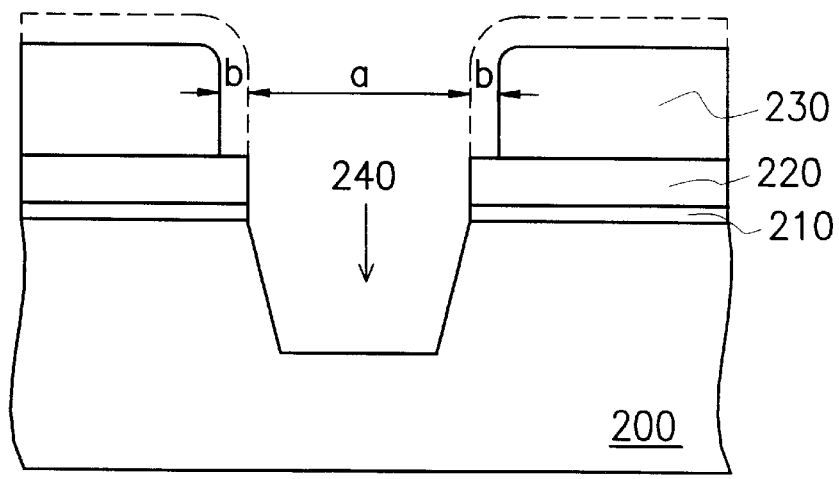

Referring to FIG. 2B, an isotropic etching process is conducted to remove a portion of the photoresist layer 230. As a result, the width of the opening 235 is widened to 'a+2b' after the isotropic etching process and a portion of the mask layer 220 is exposed. The thickness 'b' is about 180–220 Å. The isotropic etching process, preferably chemical downstream etching (CDE), is performed at a low etching rate to control the removal of the photoresist layer 230. The etching gases that can be used here are $CF_4$, $O_2$ and $N_2$, and each flow rate is about 150 to about 250 sccm, about 150 to about 250 sccm and about 20 to about 40 sccm, respectively. The pressure in the chamber is about 40 to about 50 Pa, and the RF power is about 500 to about 700 watts. The etching rate of the chemical downstream etching process is controlled by the pressure in the chamber or the flow rate of $N_2$. As the pressure in the chamber is high or the flow rate of $N_2$ is high, the etching rate of the chemical downstream etching process is low. The chemical downstream etching process can have a light etching ability on the photoresist layer or silicon dioxide and a high selectivity for the underlayer in accordance with the above recipe. In this embodiment, the chemical downstream etching process can be performed at a low etching rate of about 240 Å/min, and an excellent etching uniformity of about 3.6% for the photoresist layer 230 is obtained by using the recipe mentioned above.

Figure 2C:
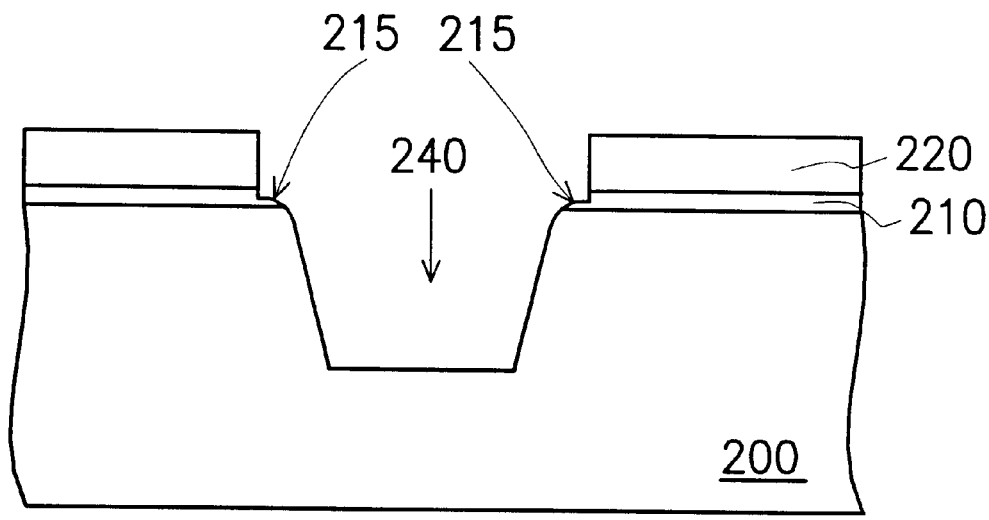

Referring to FIG. 2C, the portion of the mask layer 220 exposed by the photoresist layer 230 is removed by, for example, reactive ion etching. Next, an oxygen plasma process is performed to ash the photoresist layer 230, and then wet cleaning is performed to remove residues.

If the mask layer 220 is made of silicon nitride, the pad oxide layer 210 is made of silicon oxide and the substrate 200 is made of silicon, the reactive ion etching step requires both high silicon nitride to silicon dioxide etching selectivity and silicon nitride to silicon etching selectivity. According to the requirement of the etching step, $CH_3F$ and $O_2$ are preferably etching gases used in the etching step. The flow rate of each gas is about 12 to about 16 sccm and about 36 to about 44 sccm, respectively. The pressure in the chamber is about 45 to about 55 mtorr, and the RF power is about 200 to about 250 watts. Moreover, a temperature of a cathode is about 36 to about 44° C. By the parameters mentioned above, both the silicon nitride to silicon dioxide etching selectivity and the silicon nitride to silicon etching selectivity can be larger than 10; thus, the distortion issue caused by plasma etching is avoided. In addition, because the pad oxide layer 210 around the top corner of the trench 240 is also bombarded by plasma, a rounded corner 215 is formed at the top corner of the trench 240. By the rounded corner 215, the stress at the top corner of the trench 240 is reduced.

Figure 2D:
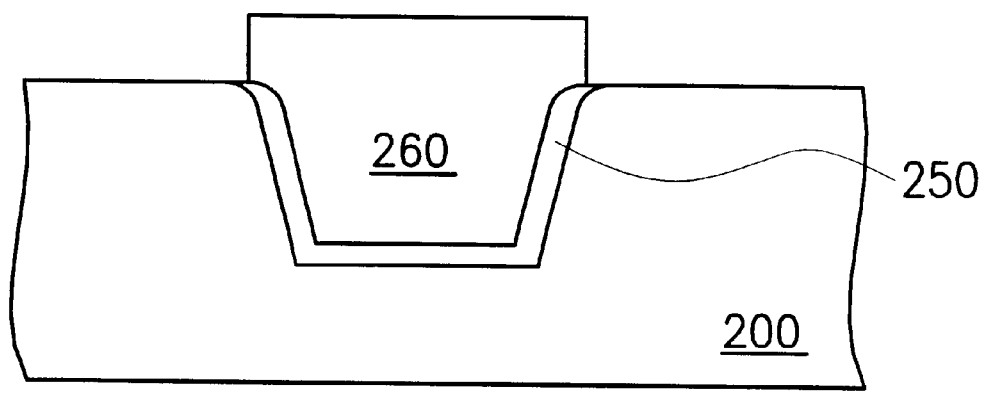

Referring to FIG. 2D, a liner oxide layer 250 is formed conformal to the trench 240, and the thickness of the liner oxide layer 250 is about 350–500 Å. An insulation layer (not shown) fills the trench 240 and covers the mask layer 220, and then a portion of the insulation layer over the mask layer 220 is removed to form a shallow trench isolation structure 260.

The liner oxide layer 250 is formed by, for example, thermal oxidation at a temperature above 900° C. A material of the insulation layer is silicon dioxide, for example. The formation of the insulation layer is preferably LPCVD with $Si(OC_2H_5)_4$, i.e. TEOS, as a gas source at a temperature of about 650 to about 750° C. and the pressure about 1 to about 10 torr. The portion of the insulation layer over the mask layer 220 is removed by, for example, chemical mechanical polishing.

Next, the mask layer 220 and the pad oxide layer 210 are removed. If the material of the mask layer 220 is silicon nitride, the mask layer 220 is removed by hot phosphoric acid, and the pad oxide layer 210 is removed by HF solution.

Since the material of the shallow trench isolation structure 260 is usually silicon dioxide, a portion of the shallow trench isolation structure 260 is also etched by HF solution. However, a portion of the mask layer 220 is removed, and the opening in the mask layer 220 exposing the trench is widened due to pullback process. As a result, the insulation layer is not only deposited in the trench 240 but also on a portion of the pad oxide layer 210. Thus, the insulation layer still covers the whole trench 240 and even a portion of the shallow trench isolation structure 260 is etched while the pad oxide layer 210 is etched with HF solution. As a result, no divot is formed near the top corner of the trench 240, and the leakage current is avoided. In addition, a portion of the mask layer 220 is removed, the opening in the mask layer 220 exposing the trench 240 is widened; thus, the insulation layer is more easily deposited in the trench 240.

In light of the foregoing, the feature of this invention is that the opening in the photoresist layer is widened by the etching step performed at a low etching rate. Then, the photoresist layer serves as a hard mask while removing a portion of the mask layer. Moreover, the rounded corner is formed at the top corner of the trench after the process of removing the portion of the mask layer.

According to the foregoing, the advantages of the invention include the following:

(1) In this invention, the divot formed near the top corner of the shallow trench isolation structure is avoided, so that the kink effect caused by the divot is avoided. Furthermore, the process window of the poly gate process is widened.

(2) By forming the rounded corner at the top of the trench, stress at the top corner of the trench is reduced; thus, the method prevents the divot from forming in the shallow trench isolation structure.

(3) The opening in the photoresist layer is widened by performing an etching step with a low etching rate; thus, the width of the opening after the pullback process is controlled.

(4) Since a portion of the mask layer is removed, the opening in the mask layer exposing the trench is widened; thus, the insulation layer is more easily deposited in the trench.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a shallow trench isolation structure, comprising the steps of:
    providing a substrate;
    forming a pad oxide layer on the substrate;
    forming a silicon nitride layer on the pad oxide layer;
    forming a photoresist layer with an opening on the silicon nitride layer;
    with the photoresist layer serving as a mask, etching the silicon nitride layer, the pad oxide layer and the substrate in sequence, so as to form a trench in the substrate;
    performing an isotropic etching process to remove a portion of the photoresist layer, wherein the opening is widened and a portion of the silicon nitride layer is exposed by the widened opening;
    removing the exposed portion of the silicon nitride layer;
    removing the photoresist layer;
    filling the trench with a silicon dioxide layer to form a shallow trench isolation structure;
    removing the silicon nitride layer; and
    removing the pad oxide layer.

2. The method of claim 1, wherein the isotropic etching includes chemical downstream etching.

3. The method of claim 2, wherein etching gases in the chemical downstream etching step include $CF_4$ with a flow rate about 150 to about 250 sccm, $O_2$ with a flow rate about 150 to about 250 sccm and $N_2$ with a flow rate about 20 to about 40 sccm.

4. The method of claim 2, wherein a pressure of the chemical downstream etching step is about 40 to about 50 Pa.

5. The method of claim 2, wherein a RF power of the chemical downstream etching step is about 500 to about 700 watts.

6. The method of claim 1, wherein a thickness of the photoresist layer removed is about 180–220 Å.

7. The method of claim 1, wherein the step of removing the portion of the silicon nitride layer exposed by the widened opening includes reactive ion etching.

8. The method of claim 7, wherein the reactive ion etching includes using $CH_3F$ and $O_2$, having respective flow rates of about 12 to about 16 sccm and about 36 to about 44 sccm.

9. The method of claim 7, wherein a pressure of the reactive ion etching step is about 45 to about 55 mtorr.

10. A pullback process applied in a shallow trench isolation structure process, comprising the steps of:
    forming a mask layer and a patterned photoresist layer on a substrate in sequence;
    with the photoresist layer serving as a mask, etching the mask layer and the substrate to form a trench in the substrate;
    performing an isotropic etching process to remove a portion of the photoresist layer, thereby exposing a portion of the mask layer;
    removing the portion of the mask layer exposed; and
    removing the photoresist layer.

11. The process of claim 10, wherein the mask layer includes a silicon nitride layer deposited by chemical vapor deposition.

12. The process of claim 10, wherein the step of removing a portion of the photoresist layer includes chemical downstream etching.

13. The method of claim 12, wherein the chemical downstream etching step uses $CF_4$, $O_2$ and $N_2$ having respective flow rates of about 150 to about 250 sccm, about 150 to about 250 sccm and about 20 to about 40 sccm.

14. The method of claim 12, wherein a pressure of the chemical downstream etching step is about 40 to about 50 Pa.

15. The method of claim 12, wherein a RF power of the chemical downstream etching step is about 500 to about 700 watts.

16. The method of claim 10, wherein a thickness of the photoresist layer removed is about 180–220 Å.

17. The process of claim 10, further comprising:
    forming a conformal liner oxide layer within the trench;
    filling the trench with an insulation layer to form a shallow trench isolation; and
    removing the mask layer.

18. The process of claim 17, wherein the insulation layer includes a silicon dioxide layer deposited by chemical vapor deposition.

19. A method of forming a shallow trench isolation structure, comprising the steps of:
   providing a substrate;
   forming a pad oxide layer on the substrate;
   forming a silicon nitride layer on the pad oxide layer;
   forming a photoresist layer with an opening on the silicon nitride layer;
   with the photoresist layer serving as a mask, etching the silicon nitride layer, the pad oxide layer and the substrate in sequence, so as to form a trench in the substrate;
   performing chemical downstream etching to remove a portion of the photoresist layer, wherein the opening is widened and a portion of the silicon nitride layer is exposed by the widened opening;
   removing the portion of the silicon nitride layer by reactive ion etching;
   removing the photoresist layer;
   filling the trench with a silicon dioxide layer to form a shallow trench isolation structure;
   removing the silicon nitride layer; and
   removing the pad oxide layer.

20. The method of claim 19, wherein a thickness of the portion of the photoresist layer that is removed is about 180–220 Å.

* * * * *